United States Patent
Kang et al.

(10) Patent No.: US 10,784,882 B2
(45) Date of Patent: Sep. 22, 2020

(54) ANALOG TO DIGITAL CONVERTER DEVICE AND METHOD OF CALIBRATING CLOCK SKEW

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Hsinchu (TW); Yu-Chu Chen, Hsinchu (TW); Man-Pio Lam, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/596,736

(22) Filed: Oct. 8, 2019

(65) Prior Publication Data
US 2020/0235748 A1    Jul. 23, 2020

(30) Foreign Application Priority Data
Jan. 23, 2019   (TW) .............................. 108102604 A

(51) Int. Cl.
*H03M 1/10*   (2006.01)
*H03M 1/12*   (2006.01)
*H03M 1/06*   (2006.01)

(52) U.S. Cl.
CPC ....... *H03M 1/1033* (2013.01); *H03M 1/0617* (2013.01); *H03M 1/1245* (2013.01)

(58) Field of Classification Search
CPC . H03M 1/1033; H03M 1/0617; H03M 1/1245
USPC .................................................. 341/112–155
See application file for complete search history.

(56) References Cited

U.S. PATENT DOCUMENTS

| | | | | |
|---|---|---|---|---|
| 8,519,875 B2 * | 8/2013 | Straayer | ............. | H03M 1/1057 327/517 |
| 8,604,954 B2 * | 12/2013 | Chen | .................... | H03M 1/1009 341/120 |
| 8,890,728 B2 * | 11/2014 | Le Dortz | ............ | H03M 1/0624 341/118 |
| 9,030,340 B1 * | 5/2015 | Waltari | ............... | H03M 1/1245 341/118 |

(Continued)

*Primary Examiner* — Lam T Mai
(74) *Attorney, Agent, or Firm* — CKC & Partners Co., LLC

(57) ABSTRACT

An analog to digital converter (ADC) device includes ADC circuitries, a calibration circuitry, and a skew adjustment circuitry. The ADC circuitries are configured to convert an input signal according to interleaved clock signals, in order to generate first quantization outputs. The calibration circuitry is configured to perform at least one calibration operation according to the first quantization outputs, in order to generate second quantization outputs. The skew adjustment circuitry is configured to determine maximum value signals, to which the second quantization outputs respectively correspond during a predetermined interval, and to average the maximum value signals to generate a reference signal, and to compare the reference signal with each of the maximum value signals to generate adjustment signals, in order to reduce a clock skew of the ADC circuitries.

18 Claims, 5 Drawing Sheets

(56) References Cited

U.S. PATENT DOCUMENTS

| | | | | |
|---|---|---|---|---|
| 9,030,341 B2* | 5/2015 | Tan | .............. | H03M 1/1052 |
| | | | | 341/118 |
| 9,088,293 B1* | 7/2015 | D'Souza | .............. | H03M 1/0836 |
| 9,444,480 B1* | 9/2016 | Zanchi | .............. | H03M 1/1009 |
| 9,513,659 B2* | 12/2016 | Wang | .............. | H03K 5/135 |
| 9,685,970 B1* | 6/2017 | Lee | .............. | H03M 1/1033 |
| 10,291,247 B1* | 5/2019 | Verbruggen | .............. | H03M 1/1023 |
| 10,298,248 B1* | 5/2019 | Vaz | .............. | H03M 1/1023 |
| 10,454,489 B2* | 10/2019 | Ryu | .............. | H03M 1/0836 |
| 10,483,996 B1* | 11/2019 | Erdmann | .............. | H03M 1/0656 |
| 10,503,857 B2* | 12/2019 | Chou | .............. | G06F 30/39 |
| 10,530,379 B1* | 1/2020 | Vaz | .............. | H03M 1/1215 |
| 10,574,250 B1* | 2/2020 | Braswell | .............. | H03M 1/1033 |
| 10,581,446 B1* | 3/2020 | Braswell | .............. | H03M 1/365 |
| 10,659,072 B1* | 5/2020 | Lu | .............. | H03M 1/1215 |
| 2007/0194960 A1* | 8/2007 | Wang | .............. | H03M 1/1004 |
| | | | | 341/120 |
| 2009/0278716 A1* | 11/2009 | Kawahito | .............. | H03M 1/1009 |
| | | | | 341/120 |
| 2011/0128171 A1* | 6/2011 | Oshima | .............. | H03M 1/1028 |
| | | | | 341/120 |
| 2013/0154867 A1* | 6/2013 | Dosho | .............. | H03M 1/1215 |
| | | | | 341/166 |
| 2013/0241755 A1* | 9/2013 | Chen | .............. | H03M 1/1009 |
| | | | | 341/120 |
| 2013/0328706 A1* | 12/2013 | Marom | .............. | G02F 7/00 |
| | | | | 341/137 |
| 2016/0049949 A1* | 2/2016 | Waltari | .............. | H03M 1/1023 |
| | | | | 341/120 |
| 2016/0079994 A1* | 3/2016 | Lee | .............. | H03M 1/181 |
| | | | | 341/118 |
| 2016/0149582 A1* | 5/2016 | Ragab | .............. | H03M 1/121 |
| | | | | 341/120 |

* cited by examiner

ANALOG TO DIGITAL CONVERTER DEVICE AND METHOD OF CALIBRATING CLOCK SKEW

RELATED APPLICATIONS

This application claims priority to Taiwan Application Serial Number 108102604, filed Jan. 23, 2019, which is herein incorporated by reference in its entirety.

BACKGROUND

Technical Field

The present disclosure relates to an analog to digital converter device. More particularly, the present disclosure relates to a time-interleaved analog to digital converter and a method of calibrating clock skew(s) thereof.

Description of Related Art

Analog to digital converters (ADC) have been widely utilized in various electronic devices, in order to convert an analog signal to a digital signal. In practical applications, the resolution and/or the linearity of the ADC may be affected by gain error(s), voltage error(s), and/or timing error(s). In regard to the timing error, in current approaches, complex circuits (e.g., additional reference ADC circuit(s) or auxiliary ADC circuit(s)) are utilized or an off-chip calibration is performed to calibrate the timing error, resulting in a higher power consumption and/or longer correction cycles of the ADC.

SUMMARY

Some aspects of the present disclosure are to provide an analog to digital converter device that includes a plurality of analog to digital converter circuitries, a calibration circuitry, and a skew adjustment circuitry. The plurality of analog to digital converter circuitries are configured to convert an input signal according to a plurality of interleaved clock signals, in order to generate a plurality of first quantization outputs. The calibration circuitry is configured to perform at least one calibration operation according to the plurality of first quantization outputs, in order to generate a plurality of second quantization outputs. The skew adjustment circuitry is configured to determine a plurality of maximum value signals, to which the plurality of second quantization outputs respectively correspond during a predetermined interval, and to average the plurality of maximum value signals to generate a reference signal, and to compare the reference signal with each of the plurality of maximum value signals to generate a plurality of adjustment signals, in order to reduce a clock skew of the plurality of analog to digital converter circuitries.

Some aspects of the present disclosure are to provide to a method of calibrating clock skews that includes the following operations: performing at least one calibration operation according to a plurality of first quantization outputs from a plurality of analog to digital converter circuitries, in order to generate a plurality of second quantization outputs; determining a plurality of maximum value signals, to which the plurality of second quantization outputs respectively correspond during a predetermined interval; averaging the plurality of maximum value signals to generate a reference signal; and comparing the reference signal with each of the plurality of maximum value signals to generate a plurality of adjustment signals, in order to reduce a clock skew of the plurality of analog to digital converter circuitries.

As described above, the ADC device and the method in the embodiments of the present disclosure may perform simple operations to obtain the information of timing skew without employing additional ADC circuits. As a result, the overall power consumption and the calibration cycle can be reduced.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 1A:
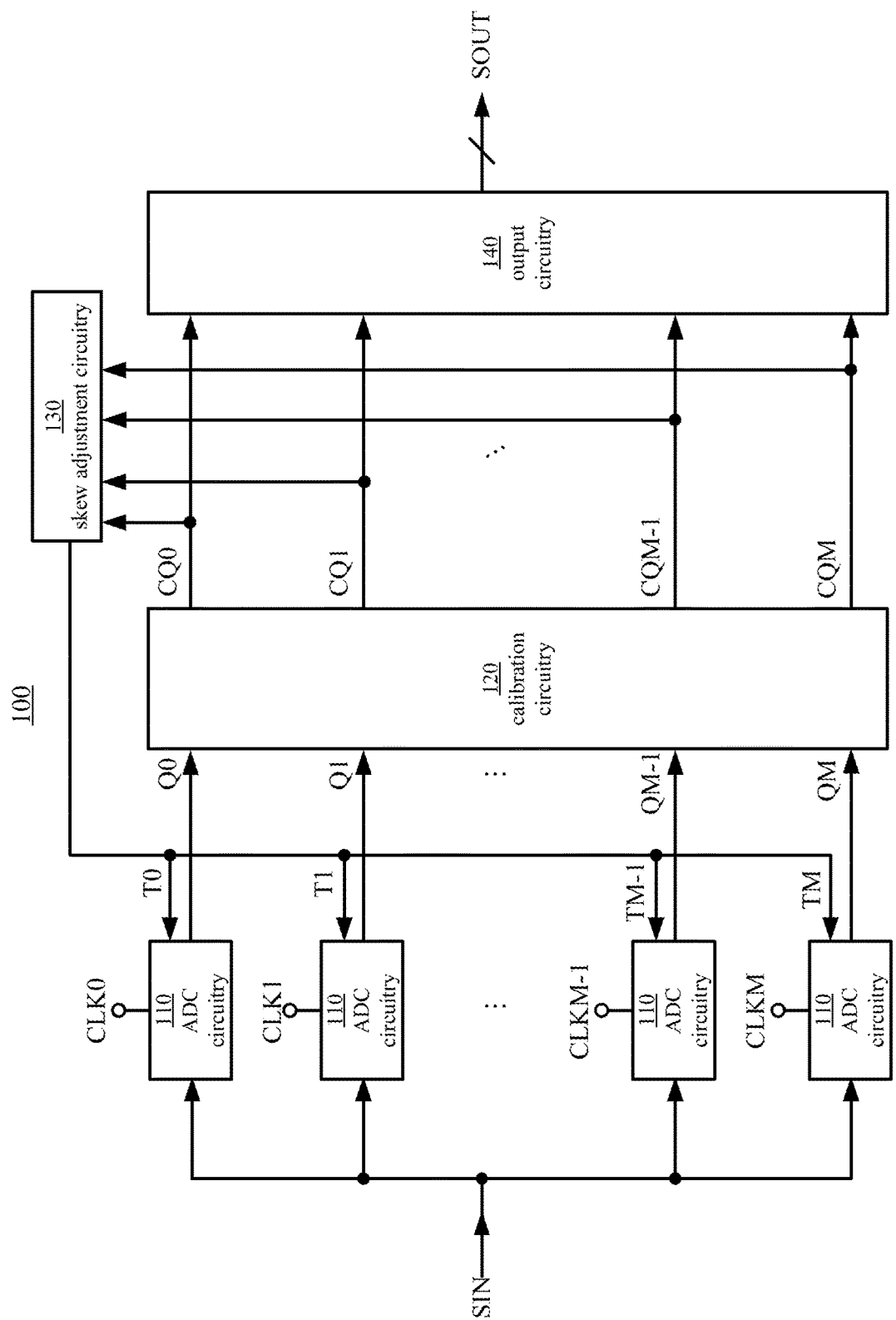
FIG. 1A is a schematic diagram of an analog-to-digital converter (ADC) device, according to some embodiments of the present disclosure.
Figure 1B:
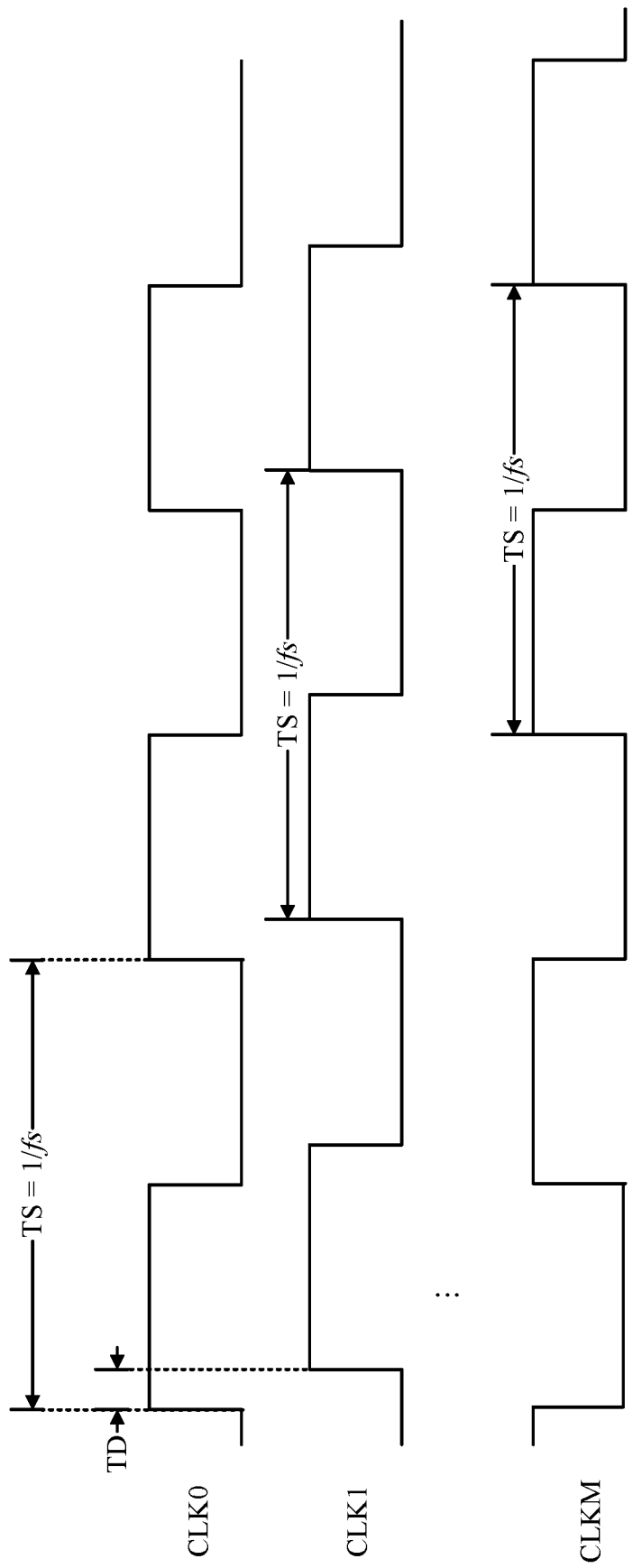
FIG. 1B is a waveform diagram of clock signals in FIG. 1A, according to some embodiments of the present disclosure.

Reference is made to FIG. 1A and FIG. 1B. FIG. 1A is a schematic diagram of an analog-to-digital converter (ADC) device 100, according to some embodiments of the present disclosure. FIG. 1B is a waveform diagram of clock signals CLK0-CLKM in FIG. 1A, according to some embodiments of the present disclosure. In some embodiments, the ADC device 100 operates as a multi-channel time-interleaved ADC.

In some embodiments, the ADC device 100 includes ADC circuitries 110, a calibration circuitry 120, a skew adjustment circuitry 130, and an output circuitry 140. Each of the ADC circuitries 110 operates as one channel. In other words, in this example, the ADC device 100 includes M+1 channels.

As shown in FIG. 1A, the ADC circuitries 110 are configured to perform an analog-to-digital conversion on an input signal SIN according to the clock signals CLK0-CLKM, in order to generate a corresponding one of quantization outputs Q0-QM. As shown in FIG. 1B, a period of each clock signal CLK0-CLKM is set as TS, which is equal to 1/fs. In other words, a sampling frequency of each ADC circuitry 110 is fs, and the combined ADC sampling frequency is (M+1)×fs.

In some embodiments, a predetermined delay TD is present between two consecutive clock signals of the clock signals CLK0-CLKM. For example, as shown in FIG. 1B, the predetermined delay TD is present between the clock signals CLK0 and CLK1. As a result, the first channel and the second channel will perform the sampling operation and the analog-to-digital conversion at different times. With this analogy, the M+1 channels are able to operate according to multiple interleaved timings.

The calibration circuitry 120 is coupled to each of the ADC circuitries 110, in order to receive the quantization outputs Q0-QM. The calibration circuitry 120 may perform at least one calibration operation according to the quantization outputs Q0-QM, in order to calibrate offset(s) and gain error(s) in the ADC circuitries 110, and to generate calibrated quantization outputs CQ0-CQM.

In some embodiments, the calibration circuitry 120 may be a foreground calibration circuit or a background calibration circuit. For example, the calibration circuitry 120 may include a pseudo number generator circuit (not shown) and a digital processing circuit (not shown). The pseudo number generator circuit generates a calibration signal to the ADC circuitries 110, and the digital processing circuit performs an adaptive algorithm (i.e. the least one calibration operation) according to the quantization outputs Q0-QM, in order to reduce the offset(s) or the error(s) in the quantization outputs Q0-QM. The aforementioned calibration circuitry 120 is given for illustrative purposes, and the present disclosure is not limited thereto. Various types of the calibration operation and those of the calibration circuitry 120 are within the contemplated scope of the present disclosure.

The skew adjustment circuitry 130 is coupled to the calibration circuitry 120, in order to receive the calibrated quantization outputs CQ0-CQM. In some embodiments, the skew adjustment circuitry 130 may analyze timing (i.e., clock) skews (i.e., phase errors) in the ADC circuitries 110 according to the quantization outputs CQ0-CQM, in order to generate adjustment signals T0-TM. The skew adjustment circuitry 130 outputs the adjustment signals T0-TM to the ADC circuitries 110, respectively. In some embodiments, the adjustment signals T0-TM are for respectively indicating timings, for the corresponding ADC circuitries 110, to be adjusted due to the timing skew(s).

Figure 2:
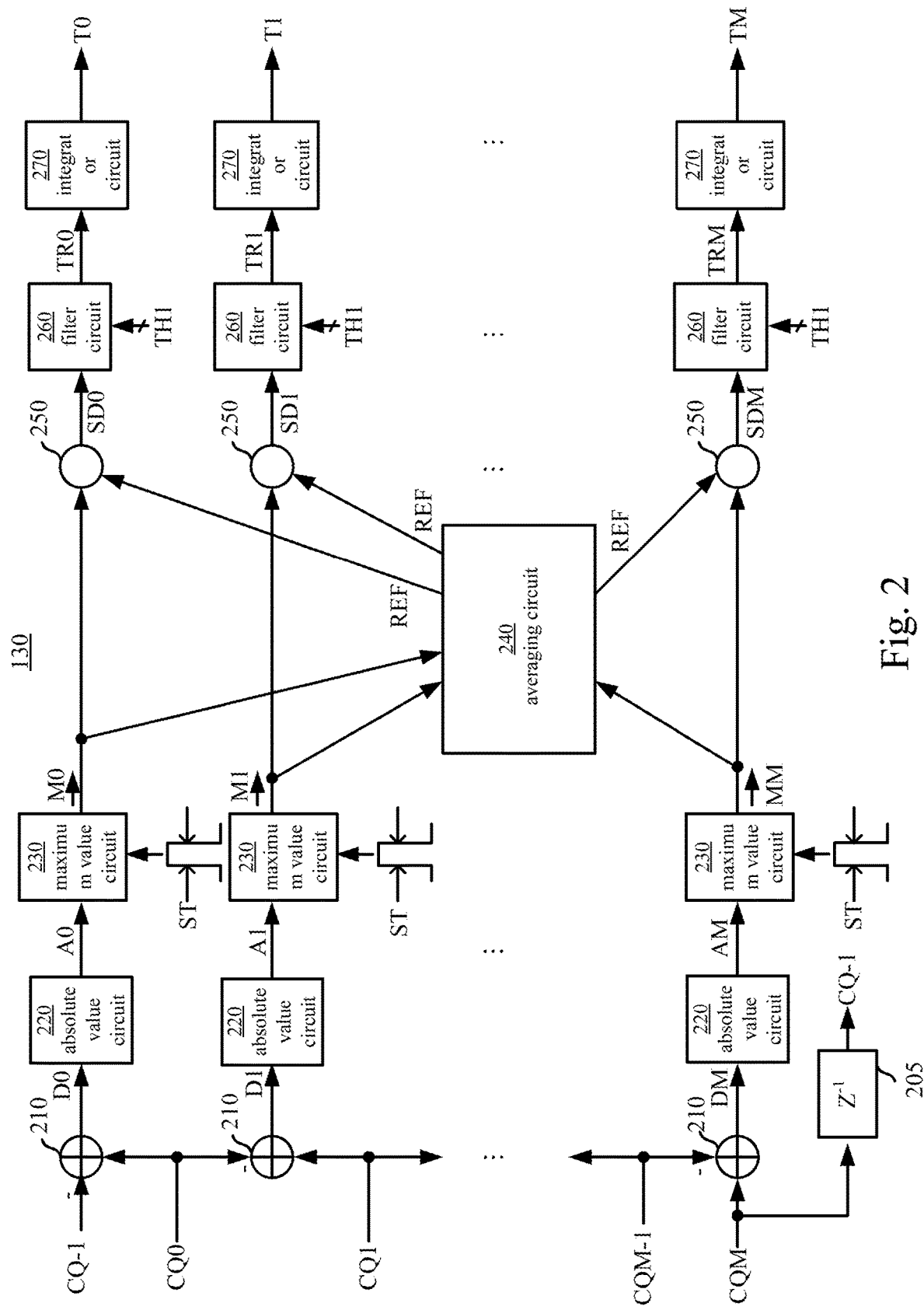
FIG. 2 is a circuit diagram of the skew adjustment circuitry in FIG. 1, according to some embodiments of the present disclosure.

In some embodiments, the skew adjustment circuitry 130 is configured to determine maximum value signals (e.g., M0-MM shown in FIG. 2), to which the quantization outputs CQ0-CQM respectively correspond in a predetermined interval (e.g., ST shown in FIG. 2), and to average these maximum value signals to generate a reference signal (e.g., REF in FIG. 2). The skew adjustment circuitry 130 further compares the reference signal with the maximum value signals, and then generates the adjustment signals T0-TM. Detailed operations regarding herein are given in the following paragraphs with reference to FIG. 2.

In some embodiments, the ADC circuitries 110 may adjust the timings of performing the analog-to-digital conversions according to the adjustment signals T0-TM, in order to calibrate the timing skews equivalently. Alternatively, in some embodiments, the timings of the clock signals CLK0-CLKM are directly adjusted according to the adjustment signals T0-TM, in order to reduce the timing skews equivalently. For example, the adjustment signals T0-TM are inputted into a clock generator, a phase interpolator, or a digital delay control line that is configured to generate the clock signals CLK0-CLKM, in order to adjust the phases of the clock signals CLK0-CLKM. The above configurations of reducing the time skews according to the adjustment signals T0-TM are given for illustrative purposes, and the present disclosure is not limited thereto.

The output circuitry 140 is coupled to the calibration circuitry 120, in order to receive the calibrated quantization outputs CQ0-CQM. The output circuitry 140 performs a data combination operation according to the calibrated quantization outputs CQ0-CQM, in order to generate a digital signal SOUT. With the data combination operation, the quantization outputs CQ0-CQM provided from the M+1 channels are combined as the single digital signal SOUT having the M+1 times of the sampling frequency fs. In some embodiments, the output circuitry 140 may be implemented with a multiplexer circuit, but the present disclosure is not limited thereto.

Reference is made to FIG. 2. FIG. 2 is a circuit diagram of the skew adjustment circuitry 130 in FIG. 1, according to some embodiments of the present disclosure. For ease of understanding, like elements in FIGS. 1-2 are designated with the same reference numbers.

In some embodiments, the skew adjustment circuitry 130 includes a delay circuit 205, arithmetic circuits 210, absolute value circuits 220, maximum value circuits 230, an averaging circuit 240, and comparator circuits 250.

The delay circuit 205 is configured to delay the quantization output CQM in FIG. 1A, in order to generate a delayed quantization output CQ−1. In some embodiments, a delay time introduced from the delay circuit 205 substantially equals to the period TS in FIG. 1B. The delay circuit 205 may be implemented with various circuits, such as a buffer, an inverter, a filter, and so on. The implementations of the delay circuit 205 are given for illustrative purposes, and the present disclosure is not limited thereto.

The arithmetic circuits 210 are coupled to the calibration circuitry 120 in FIG. 1A. The arithmetic circuits 210 receive two of the quantization outputs CQ−1 to CQM in sequence, in order to generate difference signals D0-DM respectively. Taking the first arithmetic circuit 210 as an example, the first arithmetic circuit 210 receives the quantization outputs CQ−1 and CQ0, and subtracts the quantization output CQ−1 from the quantization output CQ0 to generate the difference signal D0. The configurations of the remaining arithmetic circuits 210 can be understood with the same analogy, and thus the repetitious descriptions are not given herein.

In some embodiments, the arithmetic circuit 210 may be implemented with a subtractor circuit or other processing circuits having the same function. Various circuits to implement the arithmetic circuit 210 are within the contemplated scope of the present disclosure.

The absolute value circuits 220 are respectively coupled to the arithmetic circuits 210, in order to receive the difference signals D0-DM respectively. Each of the absolute value circuits 220 finds an absolute value of a corresponding one of the difference signals D0-DM, in order to generate a corresponding one of absolute value signals A0-AM. Taking the first absolute value circuit 220 as an example, the first absolute value circuit 220 receives the difference signal D0 and finds the absolute value of the difference signal D0 to generate the absolute value signal A0. By this analogy, the configurations and operations of the remaining absolute value circuits 220 can be understood, and thus the repetitious descriptions are not given.

In some embodiments, the absolute value circuit 220 may be implemented with a processing circuit or a rectifying circuit. Various circuits to implement the absolute value circuit 220 are within the contemplated scope of the present disclosure.

The maximum value circuits 230 are respectively coupled to the absolute value circuits 220, in order to receive the absolute value signals A0-AM respectively. Each of the maximum value circuits 230 continuously receives a corresponding absolute value signal of the absolute value signals A0-AM during a predetermined time interval ST, and finds (and outputs) a maximum value of the corresponding absolute value signal during the predetermined time interval ST as a corresponding one of maximum value signals M0-MM. Taking the first maximum value circuit 230 as an example, the first maximum value circuit 230 continuously receives the absolute value signal A0 during the predetermined time interval ST, and finds a maximum value of the absolute value signal A0 received during the predetermined time interval ST, and outputs the maximum value as the maximum value signal M0. By this analogy, the configurations and operations of the remaining maximum value circuits 230 can be understood, and thus the repetitious descriptions are not given.

In some embodiments, the maximum value circuit 230 may be implemented with a digital processing circuit, a comparator circuit, and/or a register circuit, but the present disclosure is not limited thereto. Various circuits to implement the maximum value circuit 230 are within the contemplated scope of the present disclosure.

The averaging circuits 240 are coupled to the maximum value circuits 230, in order to receive the maximum value signals M0-MM. The averaging circuits 240 are configured to perform an averaging calculation according to the maximum value signals M0-MM, in order to average the maximum value signals M0-MM to generate a reference signal REF. In some embodiments, the averaging circuit 240 may be implemented with a digital processing circuit, but the present disclosure is not limited thereto.

The comparator circuits 250 are coupled to the averaging circuit 240, in order to receive the reference signal REF. Each of the comparator circuits 250 compares a corresponding one of the maximum value signals M0-MM with the reference signal REF, in order to generate a corresponding one of the detection signals SD0-SDM. Taking the first comparator circuit 250 as an example, the first comparator circuit 250 compares the maximum value signal M0 with the reference signal REF, in order to generate the detection signal SD0. By this analogy, the configurations and operations of the remaining comparator circuits 250 can be understood, and thus the repetitious descriptions are not given.

In some embodiments, the comparator circuit 250 may be implemented with a comparator. Alternatively, in some embodiments, the comparator circuit 250 may be implemented with a subtractor circuit that subtracts a corresponding one of the maximum value signals M0-MM from the reference signal REF, to generate a corresponding one of the detection signals SD0-SDM. The implementations of the comparator circuits 250 are given for illustrative purposes, and the present disclosure is not limited thereto.

In some embodiments, the detection signals SD0-SDM may be directly outputted as the adjustment signals T0-TM in FIG. 1A. In some embodiments, the detection signals SD0-SDM are associated with timing information of the timing skew that reflects the timing skew occurred on the corresponding ADC circuitry 110. Taking operation(s) of the first arithmetic circuit 210 as an example, as shown in FIG. 2, the adjustment signal T0 is generated based on the difference value between the quantization outputs CQ0 and CQ−1. Thus, the adjustment signal T0 is for indicating a timing difference between the time T0 (i.e., timing point to which the quantization output CQ0 corresponds) and the time T−1 (i.e., timing point to which the quantization output CQ−1 corresponds). The difference signal D0 in the time domain may be derived as the following equation (1):

$$CQ_0 - CQ_{-1} = \sin(2\pi f(k+1)T) - \sin(2\pi fk(T + \Delta t)) \qquad (1)$$
$$= 2\cos(2\pi fkT + \pi fT + \pi fk\Delta T) \cdot \sin(\pi fT - \pi fk\Delta t)$$

where (k+1)T substantially corresponds to sampling timing point to which the quantization output CQ0 corresponds, k indicates each sampling point to which each quantization output CQ0 or CQ−1 corresponds, f is the frequency of the input signal SIN, T is the period TS, and Δt is the time difference.

If the frequency f is significantly lower than ½T, the equation (1) may be further derived as the following equation (2):

$$\sin(2\pi f(k+1)T) - \sin(2\pi fk(T+\Delta t)) = 2\cos(2\pi fkT + \pi fT + \pi fk\Delta t)\cdot(\pi fT - \pi fk\Delta t) \qquad (2)$$

Based on the equation (2), under the condition where the frequency f is significantly lower than ½T, the time difference Δt is associated with the amplitude of the difference signal D0 (i.e., πfT−πfkΔt). Therefore, with operations of the absolute value circuit 220 and the maximum value circuit 230, the maximum value signal M0 is able to indicate the information of the time difference Δt.

Similarly, under the condition where the frequency f is significantly lower than ½T, the reference signal REF may be derived as the following equation (3):

$$\mathrm{AVG}[\mathrm{Max}(\sin(2\pi f(k+1)T) - \sin(2\pi fk(T+\Delta t)))] = \pi fT \qquad (3)$$

Accordingly, by comparing the maximum value signal M0 with the reference signal REF, impacts of the time difference Δt introduced from the time skew can be acquired. For example, if the maximum value signal M0 is higher than the reference signal REF, impacts of the time difference Δt are determined to be positive. Under this condition, the phase of the clock signal CLK0 is incorrectly led due to impacts of the clock skew. Alternatively, if the maximum value signal M0 is lower than the reference signal REF, impacts of the time difference Δt are determined to be negative. Under this condition, the phase of the clock signal CLK0 is incorrectly lagged due to impacts of the clock skew. Thus, the logic values of the detection SD0 are different according to different comparison results, in order to indicate phase information to be adjusted, for the time skew, in the first ADC circuitry 110. With this analogy, the above operations may be applied to the various adjustment signals T0-TM and the detection signal SD0-SDM, and thus the repetitious descriptions are not further given.

In some approaches, additional circuits and/or complex circuit(s) (e.g., auxiliary ADC circuits, reference circuits, etc.) are required to obtain the information of time skew. In these approaches, a longer correction cycle is required to obtain sufficient information of time skew due to complex circuits. Compared with the above approaches, the embodiments of the present disclosure utilize simple operations (e.g., operations of subtract, absolute value, maximum value, averaging, etc.) to obtain the information of time skew without employing additional ADC circuits. As a result, compared with the above approaches, the embodiments of the present disclosure is able to achieve lower power consumption and shorter correction cycles.

In some further embodiments, the skew adjustment circuitry 130 may further include filter circuits 260 and integrator circuits 270. The filter circuits 260 are respectively coupled to the comparator circuits 250, in order to receive the detection signals SD0-SDM.

The filter circuits 260 are configured to generate trigger signals TR0-TRM according to the detection signals SD0-SDM and at least threshold value TH1. The integrator circuits 270 are respectively coupled to the filter circuits 260, in order to receive the trigger signals TR0-TRM respectively. The integrator circuits 270 generate the adjustment signals T0-TM according to the trigger signals TR0-TRM.

Taking the first filter circuit 260 and the first integrator 270 as an example, the filter circuit 260 is coupled to the first comparator circuit 250, in order to receive the detection signal SD0. In some embodiments, the filter circuit 260 may accumulate the detection signal SD0, and compare the accumulated detection signal SD0 with the at least one threshold value TH1, in order to output one or more trigger signal TR0. For example, when the accumulated detection signal SD0 is higher than the at least one threshold value TH1, the filter circuit 260 may output the accumulated detection signal SD0 as the corresponding trigger signal TR0. The first integrator circuit 270 is coupled to the first filter circuit 260, in order to receive the trigger signal TR0. The first integrator circuit 270 is configured to accumulate the trigger signal TR0, and to output the accumulated trigger signal TR0 as the adjustment signal T0, in order to cooperate with various control timings. By this analogy, the configurations and operations of the remaining filter circuit 260 and the integrator circuit 270 can be understood, and thus the repetitious descriptions are not further given.

With the filter circuits 260, the number of calibrating the timing skew can be reduced, in order to reduce the dynamic power consumption of the ADC device 100. Moreover, with the filter circuits 260, the jitter introduced from the calibration of timing skew is also reduced. With the integrator circuits 270, a timing adjustment method may be utilized to be a mechanism of adjusting value. In practical applications, the filter circuits 260 and the integrator circuits 270 may be set according to practical requirements. In addition, the threshold value TH1 may be set according to practical requirements as well.

In different embodiments, the filter circuit 260 and the integrator circuit 270 may be implemented with at least one comparator (e.g., a circuit for comparing the trigger signal with the threshold value TH1 or comparing the accumulated trigger signal), at least one register (e.g., a circuit for storing the accumulated signal or trigger signals), a reset circuit (e.g., a circuit for erase the data in the register), and/or at least one arithmetic circuit (e.g., a circuit for generating the accumulated signal or for accumulating the trigger signal). The above configurations of the filter circuit 260 and the integrator circuit 270 are given for illustrative purposes, and the present disclosure is not limited thereto.

Figure 3:
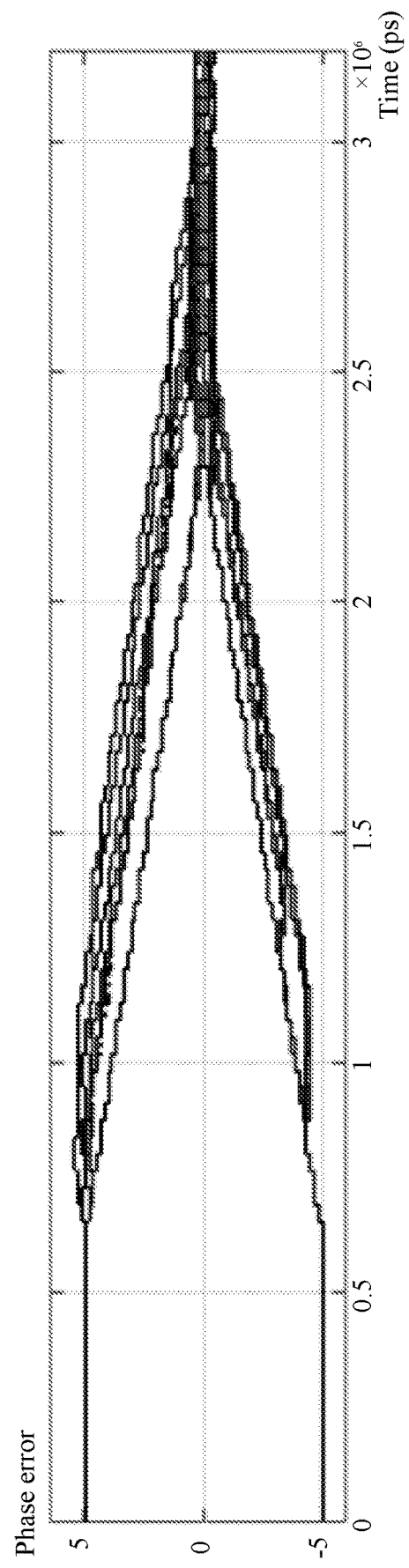
FIG. 3 is a schematic diagram of a simulation result of the calibrating the timing skew.

Reference is made to FIG. 3. FIG. 3 is a schematic diagram of a simulation result of the calibrating the timing skew.

As shown in FIG. 3, in an experimental example, the ADC device 100 is set to have 32 channels (i.e., having 32 ADC circuitries 110), and the sampling frequency fs is set to be about 3.6 GHZ. With the calibration of the above embodiments, the phase error between two of the 32 channels can be gradually and correctly reduced to zero.

Figure 4:
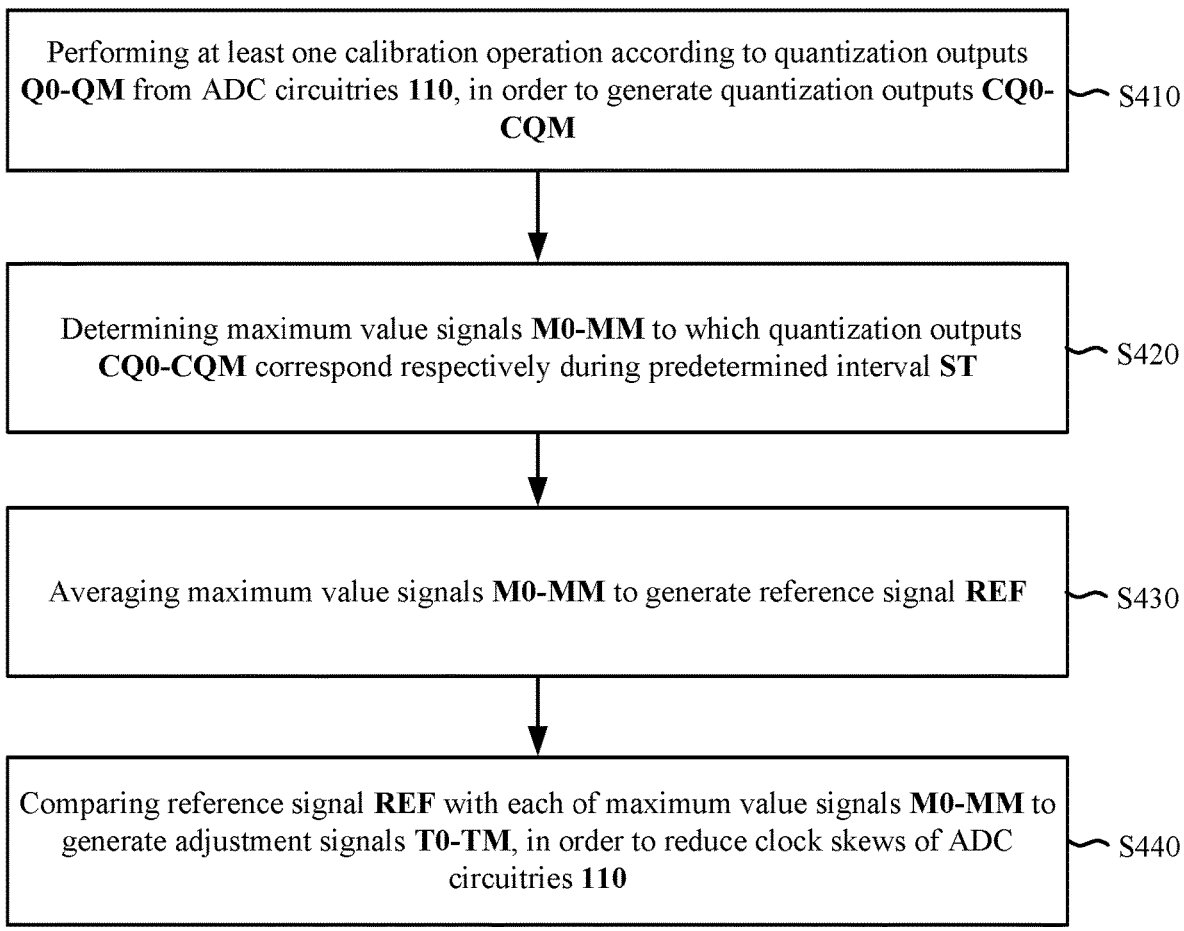
FIG. 4 is a flowchart of a method of calibrating timing (i.e., clock) skews, according to some embodiments of the present disclosure.

Reference is made to FIG. 4. FIG. 4 is a flowchart of a method 400 of calibrating timing (i.e., clock) skews, according to some embodiments of the present disclosure. For ease of understanding, the method 400 is described with reference to the above figures.

In operation S410, at least one calibration operation is performed according to the quantization outputs Q0-QM from the ADC circuitries 110, in order to generate the quantization outputs CQ0-CQM.

In operation S420, the maximum value signals M0-MM, to which the quantization outputs CQ0-CQM correspond respectively during the predetermined interval ST, are determined.

In operation S430, the maximum value signals M0-MM averaged to generate the reference signal REF.

In operation S440, the reference signal REF is compared with each of the maximum value signals M0-MM to generate the adjustment signals T0-TM, in order to reduce clock skews of the ADC circuitries 110.

The above operations may be understood with reference to embodiments in the above figures, and thus the repetitious descriptions are not given.

The above description of the method 400 includes exemplary operations, but the operations of the method 400 are not necessarily performed in the order described above. The order of the operations of the method 400 can be changed, or the operations can be executed simultaneously or partially simultaneously as appropriate, in accordance with the spirit and scope of various embodiments of the present disclosure.

As described above, the ADC device and the method in the embodiments of the present disclosure may perform simple operations to obtain the information of timing skew without employing additional ADC circuits. As a result, the overall power consumption and the calibration cycle can be reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog to digital converter device, comprising:
    a plurality of analog to digital converter circuitries configured to convert an input signal according to a plurality of interleaved clock signals, in order to generate a plurality of first quantization outputs;
    a calibration circuitry configured to perform at least one calibration operation according to the plurality of first quantization outputs, in order to generate a plurality of second quantization outputs; and
    a skew adjustment circuitry configured to determine a plurality of maximum value signals, to which the plurality of second quantization outputs respectively correspond during a predetermined interval, and to average the plurality of maximum value signals to generate a reference signal, and to compare the reference signal with each of the plurality of maximum value signals to generate a plurality of adjustment signals, in order to reduce a clock skew of the plurality of analog to digital converter circuitries.

2. The analog to digital converter device of claim 1, wherein the skew adjustment circuitry is configured to find an absolute value of each of a plurality of difference signals to generate a plurality of absolute value signals, and find a maximum value of each of plurality of absolute value signals to generate the plurality of maximum value signals, and the plurality of difference signals are generated according to the plurality of second quantization outputs.

3. The analog to digital converter device of claim 1, wherein the skew adjustment circuitry comprises:
  a delay circuit configured to delay a first one of the plurality of second quantization outputs, in order to generate a delayed quantization output;
  a plurality of arithmetic circuits configured to receive the delayed quantization output and two signals of the plurality of second quantization outputs in sequence, in order to generate a plurality of difference signals respectively;
  a plurality of absolute value circuits, wherein each one of the plurality of absolute value circuits is configured to find an absolute value of a corresponding difference signal of the plurality of difference signals, in order to generate a corresponding one of a plurality of absolute value signals;
  a plurality of maximum value circuits, wherein each one of the plurality of maximum value circuits is configured to receive a corresponding absolute value signal of the plurality of absolute value signals, and to find a maximum value of the corresponding absolute value signal, in order to output the maximum value, to which the corresponding absolute value signal corresponds during the predetermined interval, as a corresponding one of the plurality of maximum value signals;
  an averaging circuit configured to perform an averaging calculation to average the plurality of maximum value signals to generate the reference signal; and
  a plurality of comparator circuits configured to compare with the reference signal with the plurality of maximum value signals respectively, in order to generate a plurality of detection signals.

4. The analog to digital converter device of claim 3, wherein the skew adjustment circuitry outputs the plurality of detection signals as the plurality of adjustment signals.

5. The analog to digital converter device of claim 3, wherein each of the plurality of difference signals in a time domain is satisfied with the following equation:

$$\sin(2\pi f(k+1)T)-\sin(2\pi fk(T+\Delta t))=2\cos(2\pi fkT+\pi fT+\pi fk\Delta t)\cdot(\pi fT-\pi fk\Delta t),$$

wherein k indicates each sampling point to which each of the second quantization outputs corresponds, f is a frequency of the input signal, T is a period of each of the plurality of clock signals, and $\Delta t$ is a time difference.

6. The analog to digital converter device of claim 5, wherein the reference signal in the time domain is satisfied with the following equation:

$$\mathrm{AVG}[\mathrm{Max}(\sin(2\pi f(k+1)T)-\sin(2\pi fk(T+\Delta t)))]=\pi fT,$$

wherein the AVG indicates the averaging calculation, and the Max indicates an operation of finding the maximum value.

7. The analog to digital converter device of claim 3, wherein the skew adjustment circuitry further comprises:
  a plurality of filter circuits configured to generate a plurality of trigger signals according to the plurality of detection signals and at least one threshold value; and
  a plurality of integrator circuits, wherein each of the plurality of integrator circuits is configured to accumulate a corresponding trigger signal of the plurality of trigger signals, and to output the accumulated corresponding trigger signal as a corresponding adjustment signal of the plurality of adjustment signals.

8. The analog to digital converter device of claim 7, wherein each of the plurality of filter circuits is configured to accumulate a corresponding detection signal of the plurality of detection signals, and to output the accumulated corresponding detection signal as a corresponding one of the plurality of trigger signals when the accumulated corresponding detection signal is higher than the at least one threshold value.

9. The analog to digital converter device of claim 1, wherein the plurality of analog to digital converter circuitries operate as a time-interleaved analog to digital converter.

10. A method of calibrating clock skews, comprising:
  performing at least one calibration operation according to a plurality of first quantization outputs from a plurality of analog to digital converter circuitries, in order to generate a plurality of second quantization outputs;
  determining a plurality of maximum value signals, to which the plurality of second quantization outputs respectively correspond during a predetermined interval;
  averaging the plurality of maximum value signals to generate a reference signal; and
  comparing the reference signal with each of the plurality of maximum value signals to generate a plurality of adjustment signals, in order to reduce a clock skew of the plurality of analog to digital converter circuitries.

11. The method of claim 10, wherein determining the plurality of maximum value signals comprises:
  finding an absolute value of each of a plurality of difference signals to generate a plurality of absolute value signals, wherein the plurality of difference signals are generated according to the plurality of second quantization outputs; and
  finding a maximum value of each of plurality of absolute value signals, in order to generate the plurality of maximum value signals.

12. The method of claim 10, wherein determining the plurality of maximum value signals comprises:
  delaying a first one of the plurality of second quantization outputs, in order to generate a delayed quantization output;
  generating a plurality of difference signals according to the delayed quantization output and two signals of the plurality of second quantization outputs in sequence;
  finding an absolute value of a corresponding difference signal of the plurality of difference signals, in order to generate a corresponding one of a plurality of absolute value signals;
  receiving a corresponding absolute value signal of the plurality of absolute value signals, and finding a maximum value of the corresponding absolute value signal, in order to output the maximum value, to which the corresponding absolute value signal corresponds during the predetermined interval, as a corresponding one of the plurality of maximum value signals;

performing an averaging calculation to average the plurality of maximum value signals to generate the reference signal; and compare with the reference signal with the plurality of maximum value signals respectively, in order to generate a plurality of detection signals.

13. The method of claim 12, wherein the plurality of detection signals are outputted as the plurality of adjustment signals.

14. The method of claim 12, wherein the plurality of analog to digital converter circuitries convert an input signal according to a plurality of interleaved clock signals to generate the plurality of first quantization outputs, and each of the plurality of difference signals in a time domain is satisfied with the following equation:

$$\sin(2\pi f(k+1)T) - \sin(2\pi fk(T+\Delta t)) = 2\cos(2\pi fkT + \pi fT + \pi fk\Delta t) \cdot (\pi fT - \pi fk\Delta t),$$

wherein k indicates each sampling point to which each of the second quantization outputs corresponds, f is a frequency of the input signal, T is a period of each of the plurality of clock signals, and $\Delta t$ is a time difference.

15. The method of claim 14, wherein the reference signal in the time domain is satisfied with the following equation:

$$\mathrm{AVG}[\mathrm{Max}(\sin(2\pi f(k+1)T) - \sin(2\pi fk(T+\Delta t)))] = \pi fT,$$

wherein the AVG indicates the averaging calculation, and the Max indicates an operation of finding the maximum value.

16. The method of claim 12, further comprising:

generating a plurality of trigger signals according to the plurality of detection signals and at least one threshold value; and accumulating a corresponding trigger signal of the plurality of trigger signals, and to output the accumulated corresponding trigger signal as a corresponding adjustment signal of the plurality of adjustment signals.

17. The method of claim 16, wherein generating the plurality of trigger signals comprises:

accumulating a corresponding detection signal of the plurality of detection signals, and outputting the accumulated corresponding detection signal as a corresponding one of the plurality of trigger signals when the accumulated corresponding detection signal is higher than the at least one threshold value.

18. The method of claim 10, wherein the plurality of analog to digital converter circuitries operate as a time-interleaved analog to digital converter.

* * * * *